United States Patent
Chou et al.

(10) Patent No.: US 10,785,873 B1
(45) Date of Patent: Sep. 22, 2020

(54) CIRCUIT BOARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Hou-Yuan Chou, New Taipei (TW); Yi-Chih Wu, New Taipei (TW)

(73) Assignees: HONG FU JIN PRECISION INDUSTRY (WuHan) CO., I, Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/405,348

(22) Filed: May 7, 2019

(30) Foreign Application Priority Data

Apr. 3, 2019 (CN) .......................... 2019 1 0268080

(51) Int. Cl.
| | |
|---|---|
| *H05K 1/00* | (2006.01) |
| *H05K 1/14* | (2006.01) |
| *H05K 1/18* | (2006.01) |
| *H05K 1/11* | (2006.01) |

(52) U.S. Cl.
CPC ............. *H05K 1/144* (2013.01); *H05K 1/111* (2013.01); *H05K 1/115* (2013.01); *H05K 1/142* (2013.01); *H05K 1/147* (2013.01); *H05K 1/181* (2013.01); *H05K 2201/041* (2013.01); *H05K 2201/045* (2013.01); *H05K 2201/049* (2013.01); *H05K 2201/09036* (2013.01); *H05K 2201/10159* (2013.01)

(58) Field of Classification Search
CPC ........ H05K 1/144; H05K 1/111; H05K 1/115; H05K 1/142; H05K 1/147; H05K 1/181
See application file for complete search history.

(56) References Cited

U.S. PATENT DOCUMENTS

| | | | | |
|---|---|---|---|---|
| 5,201,038 A | * | 4/1993 | Fielder | G06F 13/4095 439/74 |
| 5,280,193 A | * | 1/1994 | Lin | H01L 21/565 257/685 |
| 6,416,333 B1 | * | 7/2002 | Hasegawa | G06F 13/409 361/785 |
| 10,470,308 B1 | * | 11/2019 | Chou | G06F 1/16 |
| 2002/0060361 A1 | * | 5/2002 | Sasaki | H01L 23/3128 257/698 |
| 2004/0190274 A1 | * | 9/2004 | Saito | G02B 6/43 361/783 |
| 2009/0040734 A1 | * | 2/2009 | Ochi | G06K 19/0723 361/737 |

(Continued)

*Primary Examiner* — Yuriy Semenenko
(74) *Attorney, Agent, or Firm* — ScienBiziP, P.C.

(57) ABSTRACT

A circuit board optimized for a denser component population within a standard size of footprint includes a mother board and a plurality of sub-board layers stacked on and connected to the mother board. Each of the sub-board layers has a plurality of daughter boards. The sub-board layers are composed of a first sub-board layer and a second sub-board layer. The daughter boards of the first sub-board layer are arranged on a side of the mother board, and the daughter boards of the second sub-board layer are arranged on the daughter boards of the first sub-board layer.

10 Claims, 8 Drawing Sheets

(56) References Cited

U.S. PATENT DOCUMENTS

| | | | | |
|---|---|---|---|---|
| 2010/0255690 A1* | 10/2010 | Waite | ................. | G01R 1/06772 439/65 |
| 2011/0286691 A1* | 11/2011 | Hopkins | .............. | G02B 6/3897 385/14 |
| 2015/0261265 A1* | 9/2015 | Dean | ......................... | G06F 1/20 361/679.31 |

* cited by examiner

CIRCUIT BOARD

FIELD

The subject matter herein generally relates to a circuit board.

BACKGROUND

The electronic components on the computer motherboard can communicate via multiple signal transmission lines. In the prior art, a computer motherboard can be set as a multilayer device to meet the wiring requirements of these signal transmission lines. However, such a setting of the motherboard may increase the cost of the product, and space on the main board are limited.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
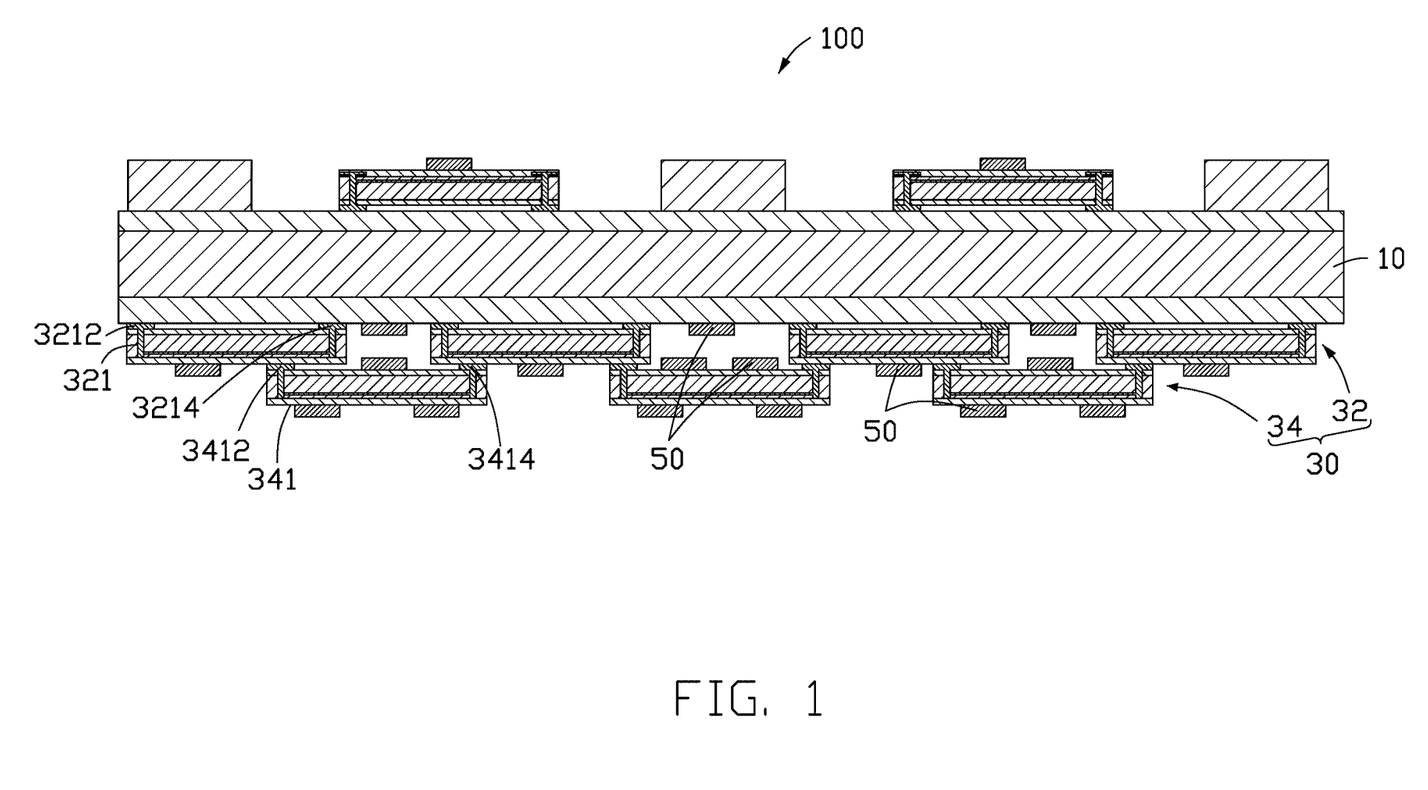
FIG. 1 is a cross sectional view of a circuit board according to an embodiment.

FIG. 1 shows a circuit board 100 optimized for a denser component population within a standard size of footprint of an embodiment. The circuit board 100 includes a mother board 10 and a plurality of sub-board layers 30. The plurality of sub-board layers 30 are stacked on the mother board 10. The sub-board layers 30 are composed of a first sub-board layer 32 and a second sub-board layer 34. Each of the sub-board layers 30 includes a plurality of daughter boards. The daughter boards 321 of the first sub-board layer 32 are arranged side by side on a side of the mother board 10 but are spaced. The daughter boards 341 of the second sub-board layer 34 are arranged, also spaced, on the daughter boards 321 of the first sub-board layer 32.

Each of the daughter boards 321 of the first sub-board layer 32 has a first end 3212 and a second end 3214. The first end 3212 and the second end 3214 of each daughter board 321 are connected to the mother board 10.

Each of the daughter boards 341 of the second sub-board layer 34 has a first end 3412 and a second end 3414. The first end 3412 and the second end 3414 of each daughter board 341 are connected to adjacent daughter boards 321 of the first sub-board layer 32.

The circuit board 100 further includes at least one component 50.

In an embodiment, the components 50 may be arranged on the mother board 10 and on an open area between the daughter boards 321 of the first sub-board layer 32.

In an embodiment, the components 50 may be arranged on at least one of the daughter boards 321 of the first sub-board layer 32 and on an open area between the daughter boards 341 of the second sub-board layer 34.

In an embodiment, the components 50 may be arranged on at least one of the daughter boards 341 of the second sub-board layer 34 and face away from the mother board 10.

In an embodiment, the components 50 may be arranged on at least one of the daughter boards 341 of the second sub-board layer 34, face the mother board 10, and be located on an open area between the daughter boards 321 of the first sub-board layer 32.

The component 50 may be a central processing unit (CPU) or a memory device, but not being limited thereto.

Figure 2:
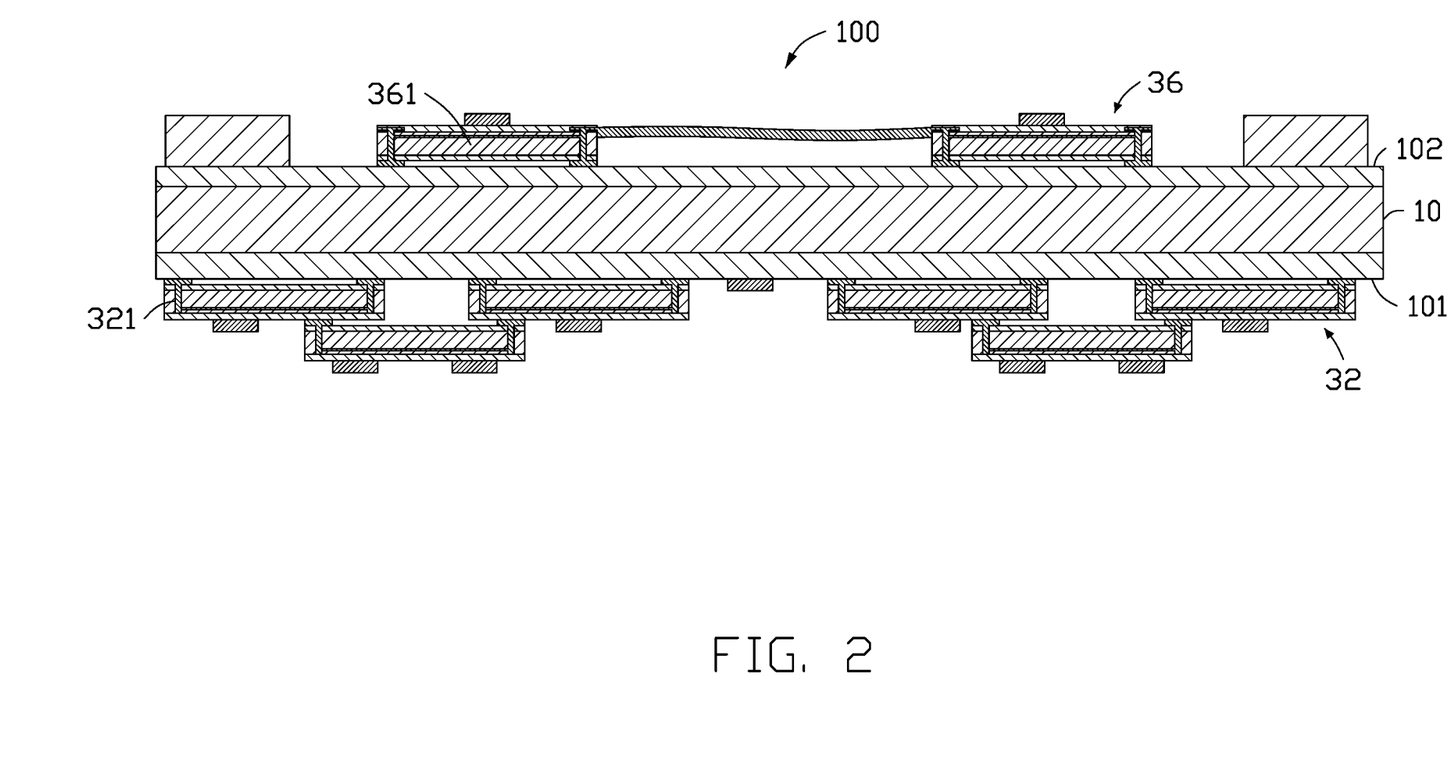
FIG. 2 is a cross sectional view of a circuit board according to another embodiment.

FIG. 2 shows a circuit board 100 of another embodiment. The mother board 10 includes a first surface 101 and a second surface 102 opposite to the first surface 101. In an embodiment, the sub-board layers 30 further have a third sub-board layer 36. The daughter boards 321 of the first sub-board layer 32 are arranged on the first surface 101, and the daughter boards 361 of the third sub-board layer 36 are arranged side by side on the second surface 102 but spaced.

In an embodiment, the daughter boards 361 of the third sub-board layer 36 are flexible printed circuit boards (FPCs).

In an embodiment, adjacent daughter boards 361 of the third sub-board layer 36 are electrically connected with each other.

In other embodiment, the sub-board layers 30 may further include fourth and greater than fourth sub-board layers. The fourth and greater than fourth sub-board layers are disposed on the second sub-board layer 34 and/or the third sub-board layer 36 and are stacked in sequence.

Figure 3:
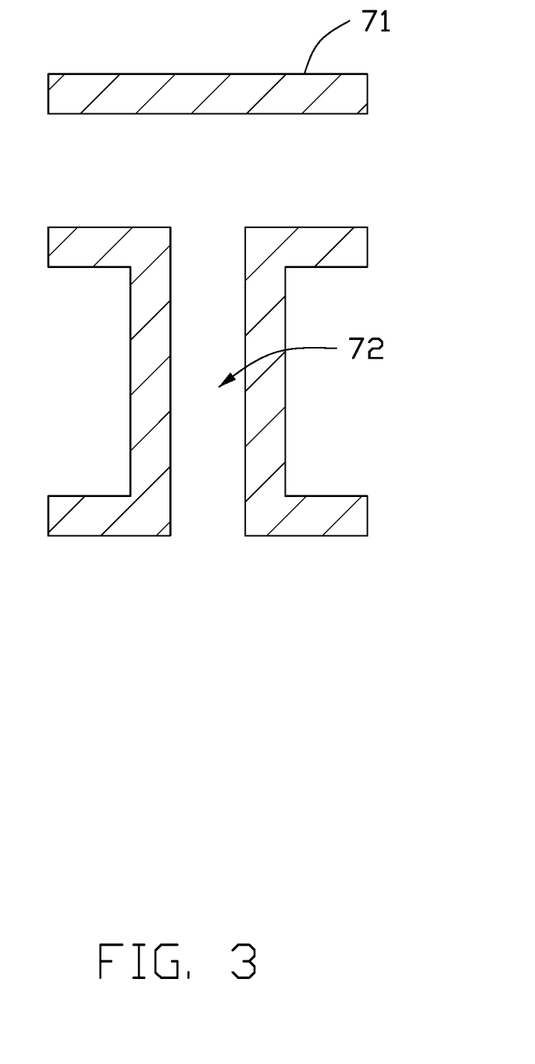
FIG. 3 is a cross sectional view of a pad and a conductive via of the circuit board according to an embodiment.
Figure 4:
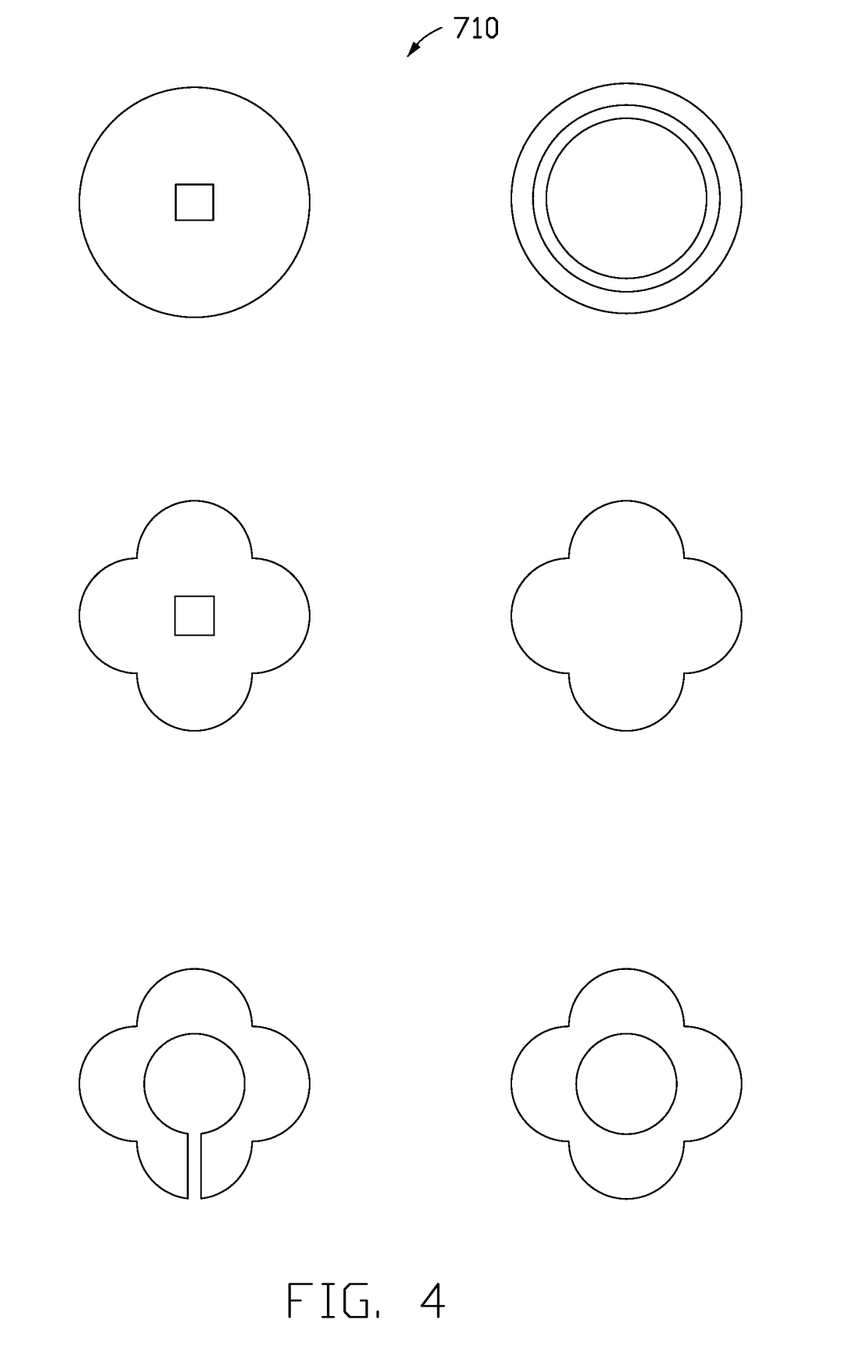
FIG. 4 to FIG. 7 show plan views of an opening of the pad in different embodiments.
Figure 5:
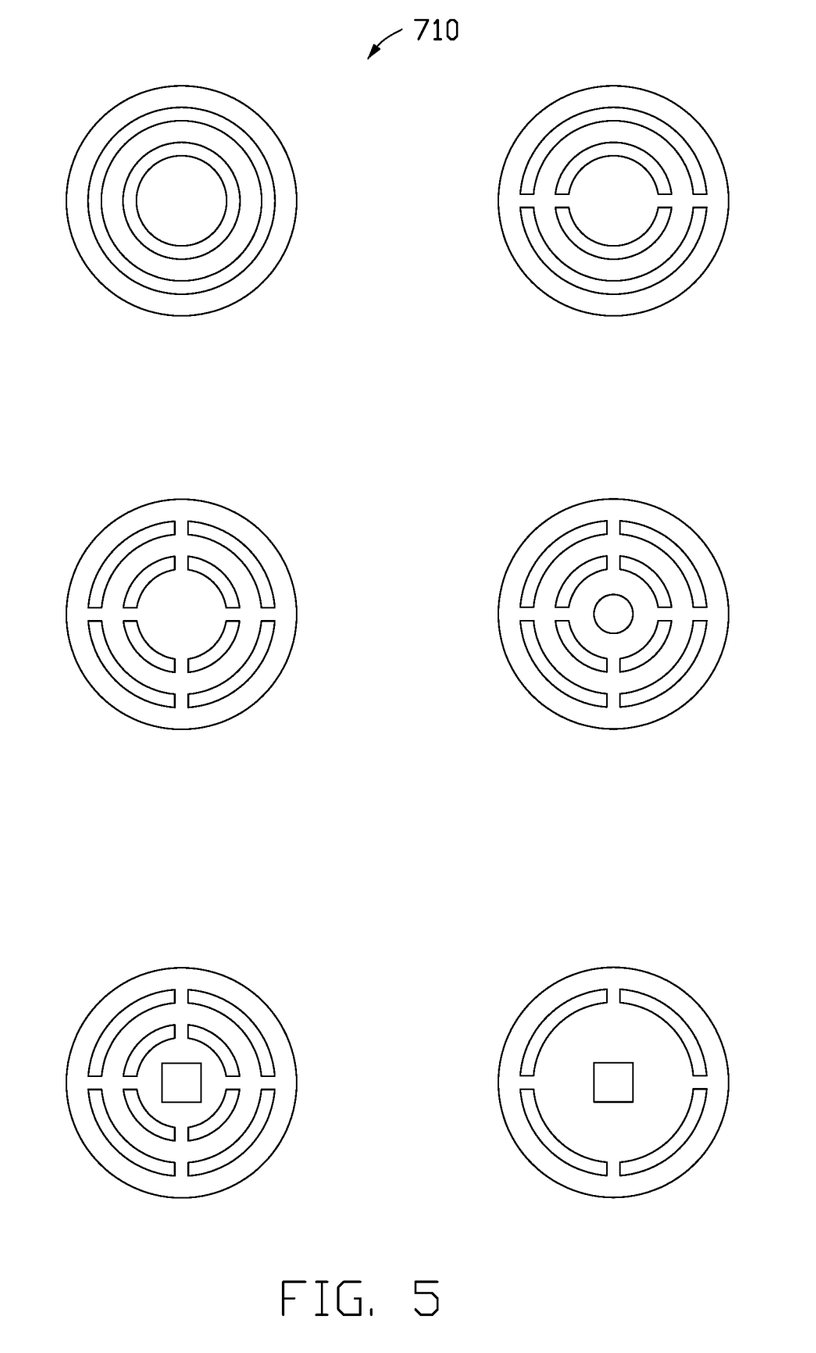
Figure 6:
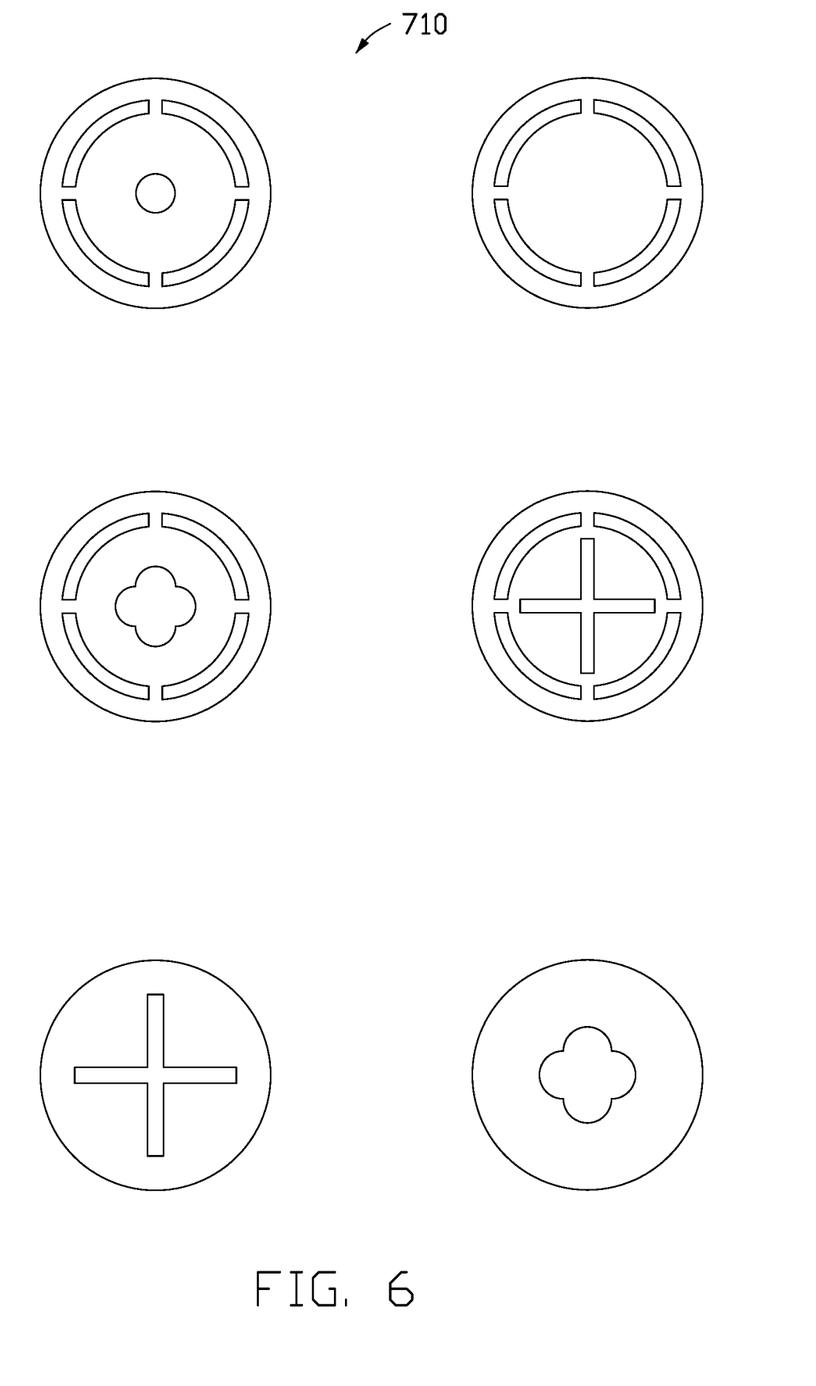
Figure 7:
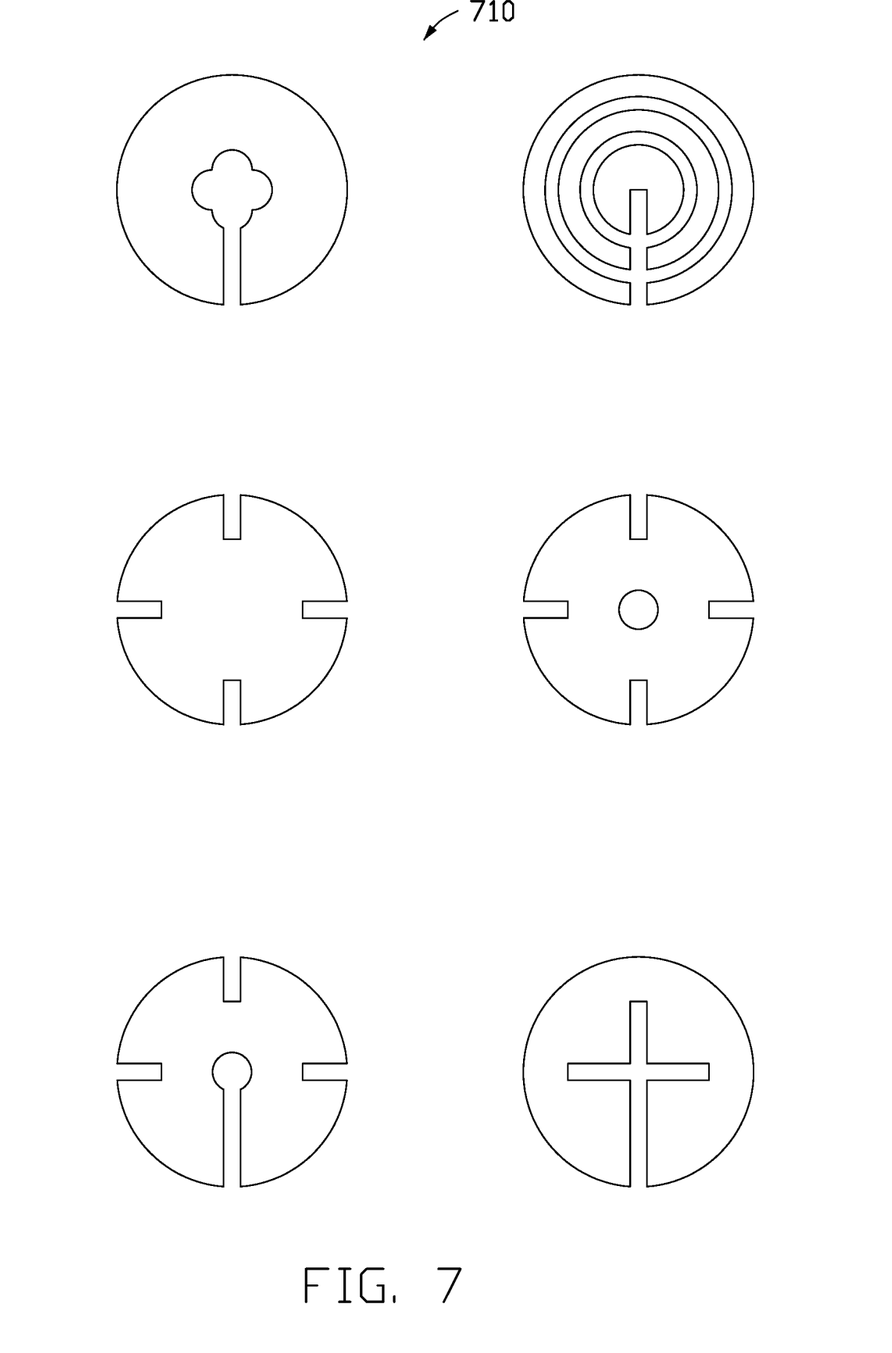

FIG. 3 shows a pad 71 and a conductive via 72 of the circuit board 100. The mother board 10 and/or at least one of the daughter boards have at least one pad 71 and at least one conductive via 72. The pad 71 enables components or wires to be connected with solder. The conductive via 72 is configured for a connection with wires. The mother board 10 and the daughter board, or the daughter board and a more distant daughter board, are electrically connected via connection between pads 71, between pads 71 and conductive vias 72, or between conductive vias 72.

In an embodiment, the pad 71 is provided with an opening 710, as shown in FIGS. 4-7. The opening 710 increases a contact area available for soldering between the pad and the pad, thereby improving connection strength. The opening 710 may be designed in various shapes. FIGS. 4-7 show plan views of the pads 71 and the openings 710 for better soldering.

Figure 8:
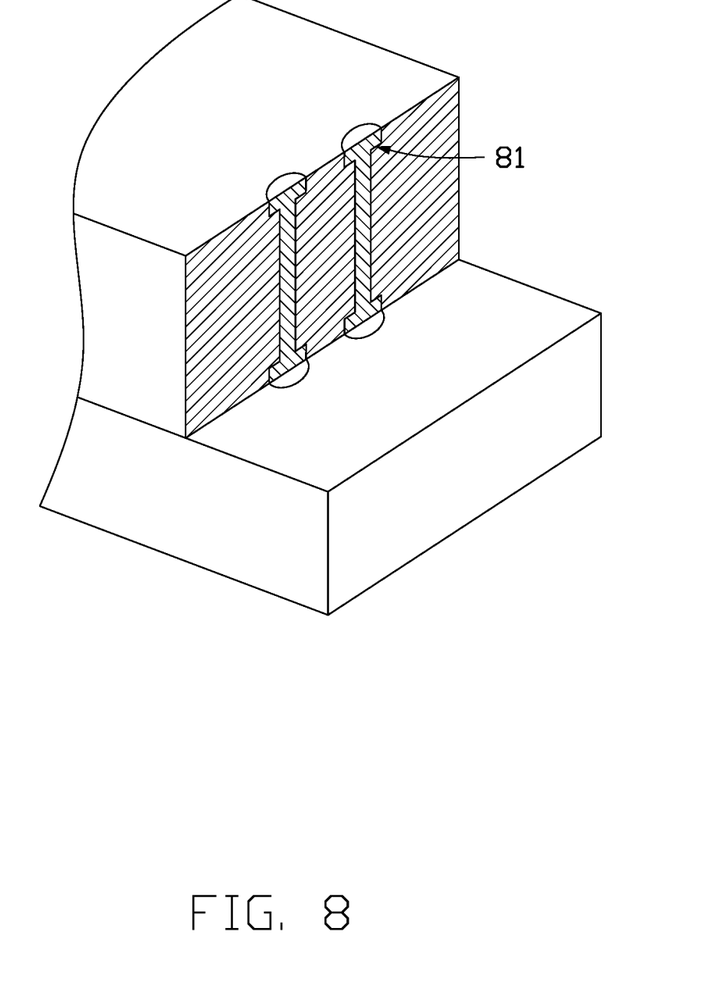
FIG. 8 shows a vertical cross section of a groove of the pad according to an embodiment.

Referring to FIG. 8, in an embodiment, the edge of the daughter board is provided with a groove 81 to facilitate cutting and splitting.

The embodiments shown and described above are only examples. Many such details are found in the art. Therefore, such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A circuit board, comprising:
   a mother board having a first face and an opposing second face; and
   a plurality layers of sub-boards stacked over the mother board;
      wherein each layer of the sub-board comprises a plurality of sub-boards;
      wherein a first layer of the sub-boards comprises a plurality of first layer sub-boards arranged on the first face of the mother board, each two of which being arranged on one face of the mother board with a separation there-between;
      wherein at least one of the first layer sub-board comprises a component exposedly arranged on a face that's opposite to the first face of the mother board;
      wherein a second layer of the sub-boards comprises a plurality of second layer sub-boards, each of which having a width larger than the separation between two of the adjacent first layer sub-boards, wherein each of the second layer sub-boards is arranged between and partially covers two adjacent ones of the first layer sub-boards while exposing the component.

2. The circuit board of claim 1, wherein a number of the second layer sub-boards is less than a number of the first layer sub-boards.

3. The circuit board of claim 1, further comprising at least one component, wherein the component is arranged on the mother board; and the component is a central processing unit or a memory device.

4. The circuit board of claim 1, further comprising at least one component, wherein the component is arranged on one of the sub-boards; and the component is a central processing unit or a memory device.

5. The circuit board of claim 1, further comprising at least one component, wherein the component is arranged on one of the second layer sub-boards, facing the mother board, and is located on an open area between two adjacent ones of the first layer sub-boards.

6. The circuit board of claim 1, further comprising a third layer of sub-boards that includes a plurality of third layer sub-boards arranged on the second face of the mother board with a separation there-between.

7. The circuit board of claim 6, further comprising a flexible printed circuit board arranged between and electrically connects two adjacent ones of the third layer sub-boards.

8. The circuit board of claim 1, wherein at least one of the mother board or one of the sub-boards includes at least one conductive via configured to enable electrical connection between two faces thereof.

9. The circuit board of claim 8, wherein at least one of the mother board or one of the sub-boards is provided with at least one pad that defines an opening for receiving solder.

10. The circuit board of claim 1, wherein an edge of at least one of the sub-boards has a groove configured to facilitate cutting and splitting.

* * * * *

UNITED STATES PATENT AND TRADEMARK OFFICE
CERTIFICATE OF CORRECTION

PATENT NO. : 10,785,873 B1
APPLICATION NO. : 16/405348
DATED : September 22, 2020
INVENTOR(S) : Hou-Yuan Chou and Yi-Chih Wu

Page 1 of 1

It is certified that error appears in the above-identified patent and that said Letters Patent is hereby corrected as shown below:

On the Title Page

Please replace Item (73) regarding "Assignee" with the following:
(73) Assignee: HONG FU JIN PRECISION INDUSTRY (Wuhan) CO.,LTD. ,Wuhan (CN);
HON HAI PRECISION INDUSTRY CO., LTD., New Taipei (TW);

Signed and Sealed this
Twenty-third Day of January, 2024

Katherine Kelly Vidal
*Director of the United States Patent and Trademark Office*